(12) United States Patent
Chae et al.

(10) Patent No.: US 12,306,665 B2
(45) Date of Patent: May 20, 2025

(54) DISPLAY APPARATUS

(71) Applicant: SAMSUNG ELECTRONICS CO., LTD., Suwon-si (KR)

(72) Inventors: Hosuk Chae, Suwon-si (KR); Junki Noh, Suwon-si (KR); Daesik Yoon, Suwon-si (KR); Minkeun Kim, Suwon-si (KR); Minchul Kim, Suwon-si (KR); Yonghwan Park, Suwon-si (KR); Hyunkyu Park, Suwon-si (KR); Hokweon Song, Suwon-si (KR)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 266 days.

(21) Appl. No.: 17/712,696

(22) Filed: Apr. 4, 2022

(65) Prior Publication Data
US 2023/0015716 A1    Jan. 19, 2023

Related U.S. Application Data

(63) Continuation of application No. PCT/KR2022/004245, filed on Mar. 25, 2022.

(30) Foreign Application Priority Data

Jul. 13, 2021   (KR) ......................... 10-2021-0091545

(51) Int. Cl.
*G06F 1/16*   (2006.01)
*H05K 5/02*   (2006.01)
*F16B 35/04*  (2006.01)

(52) U.S. Cl.
CPC .......... *G06F 1/1601* (2013.01); *G06F 1/1607* (2013.01); *H05K 5/0204* (2013.01); *F16B 35/041* (2013.01)

(58) Field of Classification Search
CPC .... G06F 1/1601; G06F 1/1607; F16B 33/002; F16B 33/02; F16B 35/041; F16M 13/02; H05K 5/0204; A47B 97/001
(Continued)

(56) References Cited

U.S. PATENT DOCUMENTS

| 995,468 | A | * | 6/1911 | Kenney | .................. F16B 39/16 411/932 |
| 2,391,232 | A | * | 12/1945 | Farrell | .................. F16B 39/16 411/932 |

(Continued)

FOREIGN PATENT DOCUMENTS

| CN | 109549375 A | * | 4/2019 | .......... A47B 97/001 |
| DE | 202015004149 U1 | * | 8/2015 | .......... G06F 1/1601 |

(Continued)

OTHER PUBLICATIONS

Samsung Electronics is releasing 'Neo QLED', the center of new life. Samsung Newsroom Korea [online]. Mar. 3, 2021. [Date of search: Jul. 11, 2022] Source: <URL: https://news.samsung.com/kr/삼성전자-새로운--라이프의-중심neo-qled 출시>.

(Continued)

*Primary Examiner* — Taylor Morris
(74) *Attorney, Agent, or Firm* — STAAS & HALSEY LLP

(57) ABSTRACT

A display apparatus fixed to a wall mount includes a display, a mounting member assembled to a rear cover of the display to fix the display to the wall mount, a set screw coupled to the mounting member and including a rotation preventer provided to limit a length thereof fastened to the mounting member, and a cap nut fastened to the set screw to fix the display apparatus to the wall mount, and having a length thereof, which is fastened to the set screw, being adjusted according to a thickness of the rear cover.

13 Claims, 15 Drawing Sheets

(58) Field of Classification Search
USPC .................................................. 361/679.21
See application file for complete search history.

(56) References Cited

U.S. PATENT DOCUMENTS

| | | | | |
|---|---|---|---|---|
| 3,244,055 A * | 4/1966 | Schuermann | ......... | F16B 35/041 |
| | | | | 411/383 |
| 3,858,479 A * | 1/1975 | Sekhon | ............... | F16B 19/1072 |
| | | | | 470/11 |
| 4,699,076 A * | 10/1987 | Curtis | .................... | B63B 34/26 |
| | | | | 24/669 |
| 5,037,259 A * | 8/1991 | Duran | .................... | F16B 39/28 |
| | | | | 411/173 |
| 5,697,745 A * | 12/1997 | Shaw | .................... | F16B 37/14 |
| | | | | 411/930 |
| 6,244,807 B1 * | 6/2001 | Garcia | .................... | F16B 37/00 |
| | | | | 411/371.1 |
| 6,273,658 B1 * | 8/2001 | Patterson | .................. | B60B 3/16 |
| | | | | 411/428 |
| 6,761,520 B1 * | 7/2004 | Dise | ..................... | F16B 37/067 |
| | | | | 411/113 |
| 7,706,139 B2 * | 4/2010 | Kim | ..................... | G06F 1/1601 |
| | | | | 361/679.21 |
| 7,719,832 B2 * | 5/2010 | Kobara | .................... | G06F 1/18 |
| | | | | 361/679.02 |
| 7,921,996 B2 * | 4/2011 | Seo | ..................... | H05K 5/0204 |
| | | | | 206/320 |
| 7,922,433 B2 * | 4/2011 | Ricciardo | ............... | F16B 39/10 |
| | | | | 411/161 |
| 8,092,115 B1 * | 1/2012 | McLeod | .................. | H04Q 1/02 |
| | | | | 411/968 |
| 8,116,101 B2 * | 2/2012 | Chang | .................... | G06F 1/1616 |
| | | | | 361/752 |
| 8,308,115 B2 * | 11/2012 | Goto | ..................... | F16B 21/09 |
| | | | | 24/453 |
| 8,434,982 B2 * | 5/2013 | Henriksen, Jr. | ....... | F16B 37/145 |
| | | | | 411/338 |
| 8,641,343 B2 * | 2/2014 | Mitrovic | ............... | F16B 37/122 |
| | | | | 411/338 |
| 8,717,771 B2 * | 5/2014 | Chen | ..................... | H05K 7/142 |
| | | | | 174/67 |
| 9,042,105 B2 * | 5/2015 | Malek | ..................... | H05K 3/42 |
| | | | | 361/752 |
| 9,320,157 B2 * | 4/2016 | Hwang | ................ | H05K 5/0204 |
| 9,591,773 B2 * | 3/2017 | Shin | .................... | H05K 5/0204 |
| 9,957,990 B2 * | 5/2018 | Jung | .................... | F16B 5/0275 |
| 10,352,348 B2 * | 7/2019 | Angelucci, III | ...... | F16B 33/002 |
| 10,400,809 B2 * | 9/2019 | Uchiyama | ............ | F16B 41/002 |
| 10,433,445 B2 * | 10/2019 | Kim | .................... | H05K 5/0017 |
| 10,690,172 B2 * | 6/2020 | Chen | .................... | F16B 37/048 |
| 11,395,548 B2 * | 7/2022 | Yoon | .................... | H05K 7/14 |
| 2004/0232298 A1 * | 11/2004 | Bremmon | .............. | F16M 13/02 |
| | | | | 248/397 |
| 2005/0087666 A1 | 4/2005 | Hwang | | |
| 2006/0280579 A1 * | 12/2006 | Seidl | .................... | F16B 5/0233 |
| | | | | 411/546 |
| 2006/0283288 A1 * | 12/2006 | Feltrin | .................... | B62M 3/00 |
| | | | | 74/594.1 |
| 2007/0057133 A1 * | 3/2007 | Cottingham | .......... | F16M 13/02 |
| | | | | 248/309.1 |
| 2012/0037773 A1 * | 2/2012 | Hsu Huang | ............ | H04N 5/642 |
| | | | | 248/224.8 |
| 2013/0155587 A1 * | 6/2013 | Take | ..................... | H05K 5/0204 |
| | | | | 361/679.01 |
| 2013/0170895 A1 * | 7/2013 | Tseng | ..................... | F16B 35/06 |
| | | | | 403/270 |
| 2015/0252828 A1 * | 9/2015 | Hurst | .................... | F16B 37/145 |
| | | | | 411/366.1 |
| 2016/0010679 A1 * | 1/2016 | Makino | ................. | F16B 37/067 |
| | | | | 411/34 |
| 2018/0010735 A1 | 1/2018 | Smolek et al. | | |
| 2019/0176961 A1 * | 6/2019 | Tulloch | ................ | F16B 37/048 |
| 2020/0173483 A1 * | 6/2020 | Tamm | .................. | F16B 31/021 |
| 2020/0386258 A1 * | 12/2020 | Size, Jr. | ................ | F16B 33/002 |
| 2021/0018026 A1 * | 1/2021 | Purwin | ................ | F16B 35/041 |
| 2023/0247784 A1 * | 8/2023 | Cho | ..................... | H01L 25/167 |
| | | | | 361/807 |

FOREIGN PATENT DOCUMENTS

| | | | | | |
|---|---|---|---|---|---|
| DE | 102017129827 B3 | * | 3/2019 | .......... | G06F 1/1601 |
| EP | 3851614 A1 | | 7/2021 | ........ | E04G 17/0644 |
| JP | 2000333100 A | * | 11/2000 | .......... | G06F 1/1601 |
| JP | 3934769 B2 | | 6/2007 | | |
| JP | 2012-191528 | | 10/2012 | | |
| JP | 2012-234050 | | 11/2012 | | |
| JP | 2013021852 A | * | 1/2013 | .......... | H05K 7/1432 |
| KR | 20050036638 A | * | 4/2005 | .............. | H01J 11/10 |
| KR | 10-2006-0071132 | | 6/2006 | | |
| KR | 20080008834 A | * | 1/2008 | ............... | G09G 3/28 |
| KR | 20080008835 A | * | 1/2008 | ............... | G09G 3/28 |
| KR | 10-0869552 B1 | | 11/2008 | | |
| KR | 10-0919714 | | 10/2009 | | |
| KR | 10-2013-0129003 | | 11/2013 | | |
| KR | 20140067771 A | * | 6/2014 | .......... | H05K 5/0204 |
| KR | 10-2017-0062620 | | 6/2017 | | |
| KR | 10-1862656 | | 5/2018 | | |
| KR | 10-1936760 B1 | | 4/2019 | | |
| KR | 10-2039143 B1 | | 10/2019 | | |
| KR | 10-2020-0007505 | | 1/2020 | | |
| KR | 10-2520148 | | 4/2023 | | |
| WO | WO-2004106753 A1 | * | 12/2004 | .......... | F16B 33/002 |
| WO | WO-2015087462 A1 | * | 6/2015 | .......... | F16M 11/041 |
| WO | WO-2020060554 A1 | * | 3/2020 | .......... | G06F 1/1656 |

OTHER PUBLICATIONS

International Search Report dated Jul. 22, 2022 for International Application No. PCT/KR2022/004245.

Written Opinion from the International Searching Authority dated Jul. 22, 2022 for International Application No. PCT/KR2022/004245.

* cited by examiner

DISPLAY APPARATUS

CROSS-REFERENCE TO RELATED APPLICATION(S)

This application is continuation application, under 35 U.S.C. § 111(a), of international application No. PCT/KR2022/004245, filed on Mar. 25, 2022 which claims priority to Korean Patent Applications No. 10-2021-0091545, filed on Jul. 13, 2021 in the Korean Intellectual Property Office, the disclosure of which is incorporated by reference herein in its entirety.

BACKGROUND

1. Field

The disclosure relates to a structure provided to fix a display apparatus to a wall mount by using a set screw.

2. Description of Related Art

In general, a display apparatus is a device that displays a screen, and includes a monitor or a television. A self-luminous display panel such as an organic light-emitting diode (OLED) and a non-self-luminous display panel such as a liquid crystal display (LCD) panel are used for the display apparatus.

The display apparatus may include a display displaying an image, a support device supporting the display, and the like. Because the display is substantially formed in the shape of a plate, a stand may be used as a support device in the floor-standing display. Further in the wall-mounted display, a wall mount fixed to the wall may be used as a support device.

When the display is fixedly supported on the wall mount, the display is fixed to the wall mount by a screw fastened to the rear cover of the display and a holder fastened to the screw.

However, because the standard of the holder fixed to the wall mount is determined, there is a difficulty in that the display uses several types of screws having different lengths according to the design and thickness of the rear cover.

SUMMARY

Additional aspects of the disclosure will be set forth in part in the description which follows and, in part, will be obvious from the description, or may be learned by practice of the disclosure.

In accordance with an aspect of the disclosure, a display apparatus fixable to a wall mount, the display apparatus includes a display, a mounting member connectable to a rear cover of the display and configured to receive a set screw to fix the display to the wall mount, the set screw fastenable to an interior of the mounting member and including a rotation preventer provided to limit a length of the set screw received into the mounting member, and a cap nut fastenable to an end of the set screw to fix the display apparatus to the wall mount while the cap nut is fastened to the end of the set screw, the cap nut being fastened to the set screw based on a thickness of the rear cover.

The set screw may further include a first male screw fastenable to the mounting member and a second male screw fastenable to the cap nut.

The rotation preventer may be a non-threaded section and formed between the first male screw and the second male screw.

The rotation preventer may be formed at a position in which a length of the first male screw is less than a depth of the mounting member.

The rear cover may include a first rear cover connectable to the mounting member, and a second rear cover connectable to a rear surface of the first rear cover.

The first rear cover may include an assembly hole to which the mounting member is insertable.

The second rear cover may include a through hole through which the set screw passes, and the through hole may be formed at a position corresponding to the assembly hole.

The cap nut may include a fastening hole including in which a female screw fastened to the second male screw is formed on an inner peripheral surface thereof, and a fixer fixed to the wall mount.

The fastening hole may be formed to allow an end of the second male screw to pass through the cap nut, and thus a length of the fastening hole fastened to the second male screw may be adjusted according to a thickness of the second rear cover.

The first rear cover may include an assembly member in which the assembly hole is formed, and the assembly member may be formed to protrude toward the second rear cover.

The assembly hole may include a hexagonal shape to prevent rotation of the mounting member inserted into to the assembly hole.

The mounting member may include an insertion member formed in a cylindrical shape and insertable into the assembly hole, a fastening groove to which the set screw is fastened, and a flange provided between the insertion member and the fastening groove formed to protrude from an outer peripheral surface of the mounting member to have a larger diameter than the assembly hole.

The flange may be caught in the assembly hole to allow the mounting member to be fixed in a direction in which mounting member is inserted into the assembly hole.

The mounting member may be fixed to the first rear cover by press-fitting the insertion member in a state in which the insertion member is inserted into the assembly hole.

The insertion member may be pressed-fitted so as to be deformed into a hexagonal shape corresponding to the assembly hole, thereby preventing rotation thereof, and a fixer having a larger diameter than the assembly hole may be formed and thus the mounting member may be fixed to the first rear cover by the flange and the fixer.

In accordance with another aspect of the disclosure, a display apparatus fixed to a wall mount, the display apparatus includes a display, a first rear cover assembled to a rear surface of the display and including a plurality of assembly holes, a second rear cover assembled to a rear surface of the first rear cover and including a plurality of through-holes formed at a position corresponding to the plurality of assembly holes, a plurality of mounting members assembled to the plurality of assembly holes to fix the display to the wall mount, a plurality of set screws fastened to the mounting member by passing through the plurality of through holes, and a cap nut fastened to each of the plurality of set screws to fix the display apparatus to the wall mount, and having a length thereof, which is fastened to the set screw, being adjusted according to a thickness of the second rear cover.

The set screw may further include a first male screw fastened to the mounting member, a second male screw fastened to the cap nut, and a rotation preventer formed between the first male screw and the second male screw so as to prevent rotation of the set screw.

The mounting member may include a fastening groove to which the first male screw is fastened, and the rotation preventer may be formed at a position in which a length of the first male screw is less than a depth of the fastening groove.

The cap nut may include a fastening hole in which a female screw fastened to the second male screw is formed on an inner peripheral surface thereof, and a fixer fixed to the wall mount.

The fastening hole may be formed to allow an end of the second male screw to pass through the cap nut, and thus a length of the fastening hole fastened to the second male screw may be adjusted according to a length of the set screw protruding outside the second rear cover.

BRIEF DESCRIPTION OF THE DRAWINGS

The above and other aspects, features, and advantages of certain embodiment of the present disclosure will be more apparent from the following description of embodiments, taken in conjunction with the accompanying drawings of which.

DETAILED DESCRIPTION

Figure 1:
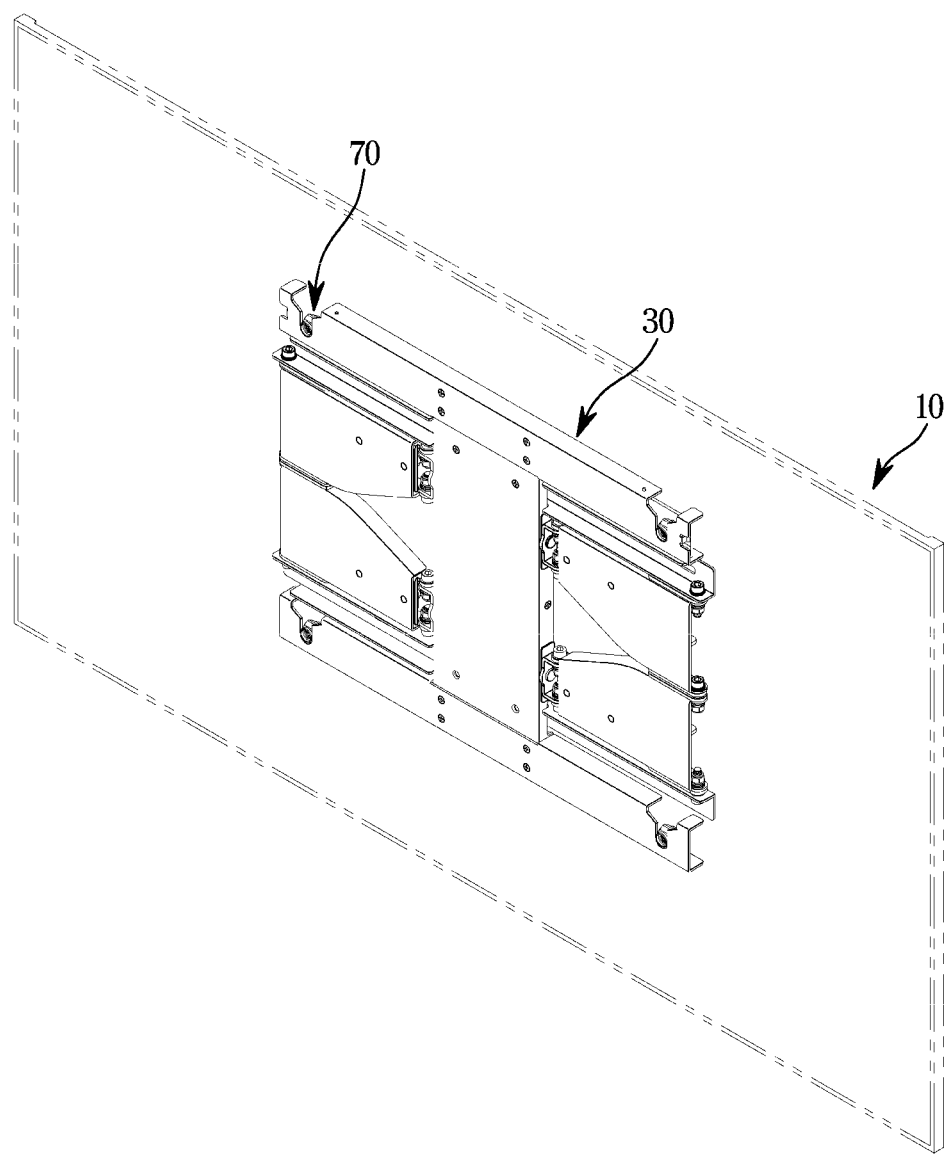
FIG. 1 is a view illustrating a state in which a display apparatus is fixed to a wall mount according to an embodiment of the disclosure.

Embodiments described in the disclosure and configurations illustrated in the drawings are merely examples of the embodiments of the disclosure, and may be modified in various different ways at the time of filing of the present application to replace the embodiments and drawings of the disclosure.

In addition, the same reference numerals or signs illustrated in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

In the following detailed description, the terms of "front end", "rear end", "upper", "lower", "front surface", "rear surface", "upper end", "lower end" and the like may be defined by the drawings, but the shape and the location of the component is not limited by the term.

Therefore, it is an aspect of the disclosure to provide a display apparatus including an improved structure provided to fix the display apparatus to a wall mount by utilizing a set screw fastened to a display and by utilizing a cap nut fastened to the set screw. Hereinafter an embodiment according to the disclosure will be described in detail with reference to the accompanying drawings.

Figure 2:
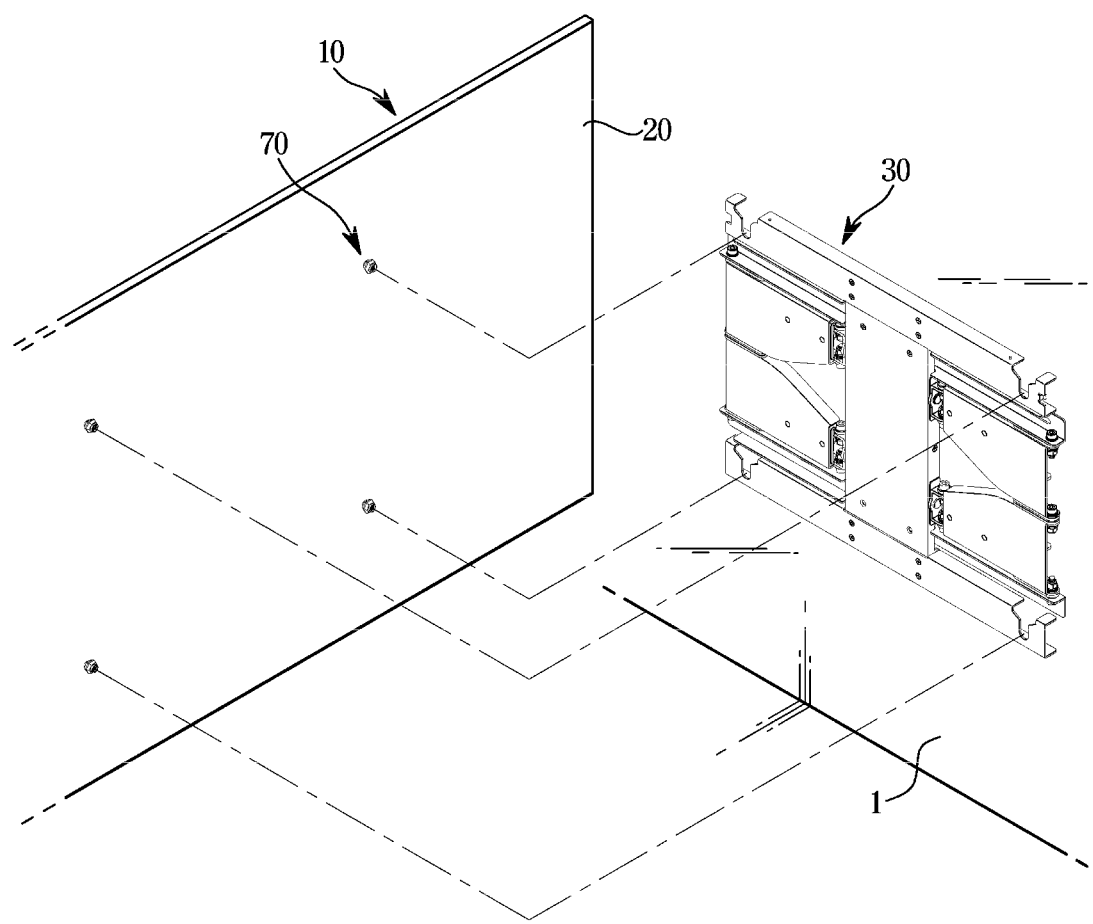
FIG. 2 is a view illustrating a state in which the display apparatus is being fixed to the wall mount fixed to a wall according to an embodiment of the disclosure.
Figure 3:
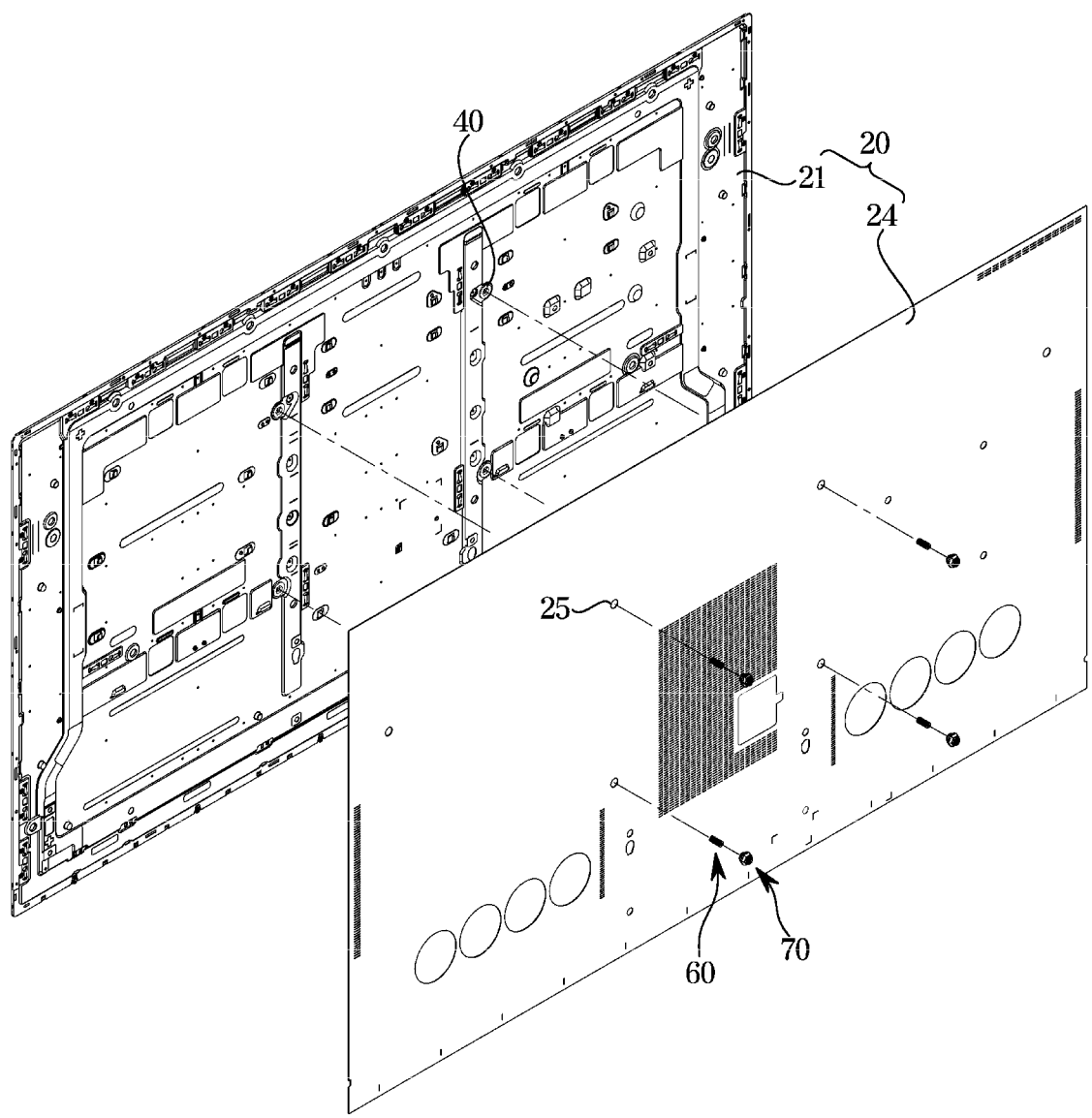
FIG. 3 is a view illustrating a state in which a second rear cover is being assembled to a rear surface of a first rear cover, to which a mounting member is assembled, and a set screw and a cap nut are being fastened to the mounting member according to an embodiment of the disclosure.

FIG. 1 is a view illustrating a state in which a display apparatus is fixed to a wall mount according to an embodiment of the disclosure. FIG. 2 is a view illustrating a state in which the display apparatus is being fixed to the wall mount fixed to a wall according to an embodiment of the disclosure. FIG. 3 is a view illustrating a state in which a second rear cover is being assembled to a rear surface of a first rear cover, to which a mounting member is assembled, and a set screw and a cap nut are being fastened to the mounting member according to an embodiment of the disclosure.

A flat display apparatus is described as an example in an embodiment of the disclosure. However, it should be understood that the display apparatus may be implemented as a curved display apparatus including a fixed curvature-screen and a curvature-variable display apparatus in which a curvature of the current screen is changed by a user input, but is not limited thereto, by those of ordinary skill in the art.

As illustrated in FIGS. 1 to 3, the display apparatus may be fixed to a wall mount 30. The display apparatus may include a display 10 displaying an image, and a rear cover 20 assembled to a rear surface of the display 10.

The rear cover 20 may include a first rear cover 21 assembled to the rear surface of the display 10. The rear cover 20 may include a second rear cover 24 assembled to the rear surface of the first rear cover 21.

The first rear cover 21 may include an assembly member 22 (refer to FIG. 8) formed with a panel including a small thickness and to which the mounting member 40 is assembled. The assembly member 22 may be formed in such a way that the first rear cover 21 protrudes toward the second rear cover 24 rather than other surface. The assembly member 22 may be provided in plurality in the first rear cover 21. Although it is illustrated that the four assembly members 22 are formed in the drawing, the disclosure is not limited thereto. An assembly hole 23 (refer to FIG. 8), to which the mounting member 40 is assembled, may be formed in each assembly member 22.

The second rear cover 24 may be connected to the rear surface of the first rear cover 21 to form a rear exterior of the display 10. The second rear cover 24 may include a plurality of through-holes 25. The plurality of through-holes 25 may be formed at positions corresponding to the plurality of assembly holes 23 formed in the first rear cover 21. A set screw 60 to be described below may pass through each of the plurality of through-holes 25. The set screw 60 passing through the plurality of through-holes 25 may be fastened to the mounting member 40.

The mounting member 40 may be assembled by being press-fitted into the assembly hole 23 of the first rear cover 21. The mounting member 40 may be assembled to the first rear cover 21 to fix the display apparatus to the wall mount 30.

The mounting member 40 may include a fastening groove 41 to which the set screw 60 is fastened. A female screw to which the set screw 60 is fastened may be formed on an inner peripheral surface of the fastening groove 41.

The set screw 60 may be fastened to the mounting member 40 to fix the display apparatus to the wall mount 30. The set screw 60 may be fastened to the fastening groove 41 of the mounting member 40. A cap nut 70 fixed to the wall mount 30 may be fastened to the set screw 60.

Figure 4:
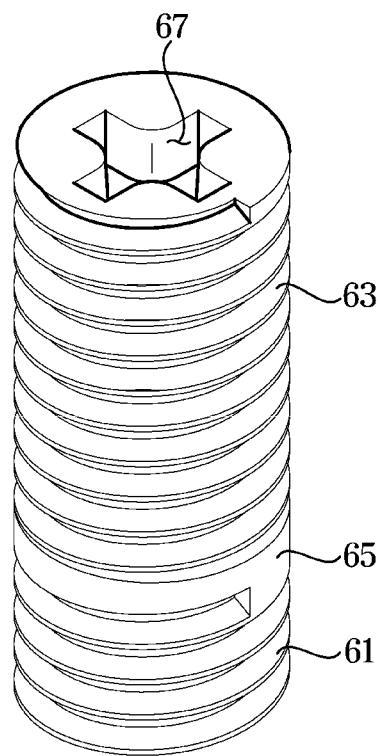
FIG. 4 is a view illustrating the set screw according to an embodiment of the disclosure.
Figure 5:
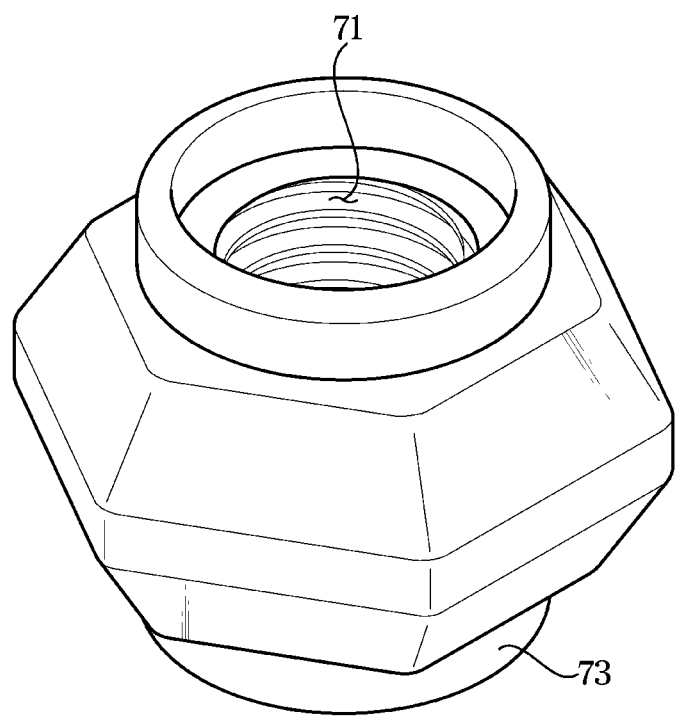
FIG. 5 is a view illustrating the cap nut according to an embodiment of the disclosure.
Figure 6:
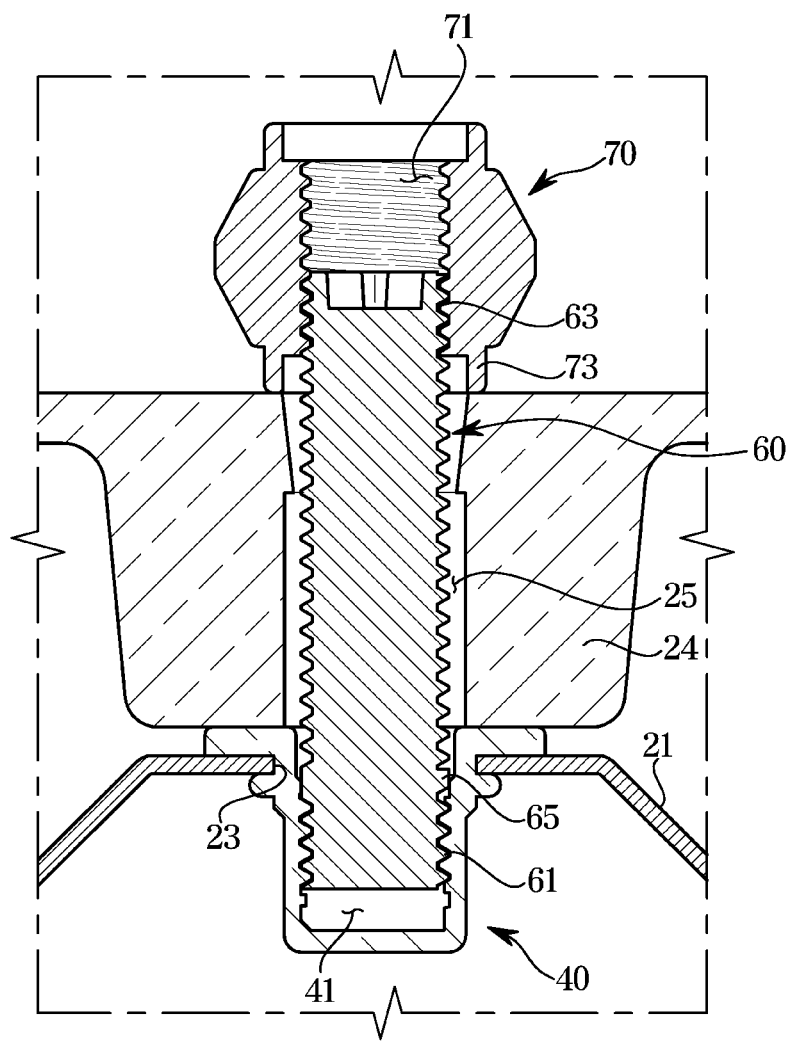
FIG. 6 is a cross-sectional view illustrating a state in which the set screw is fastened to the mounting member assembled to the first rear cover and the cap nut is fastened to the set screw according to an embodiment of the disclosure.
Figure 7:
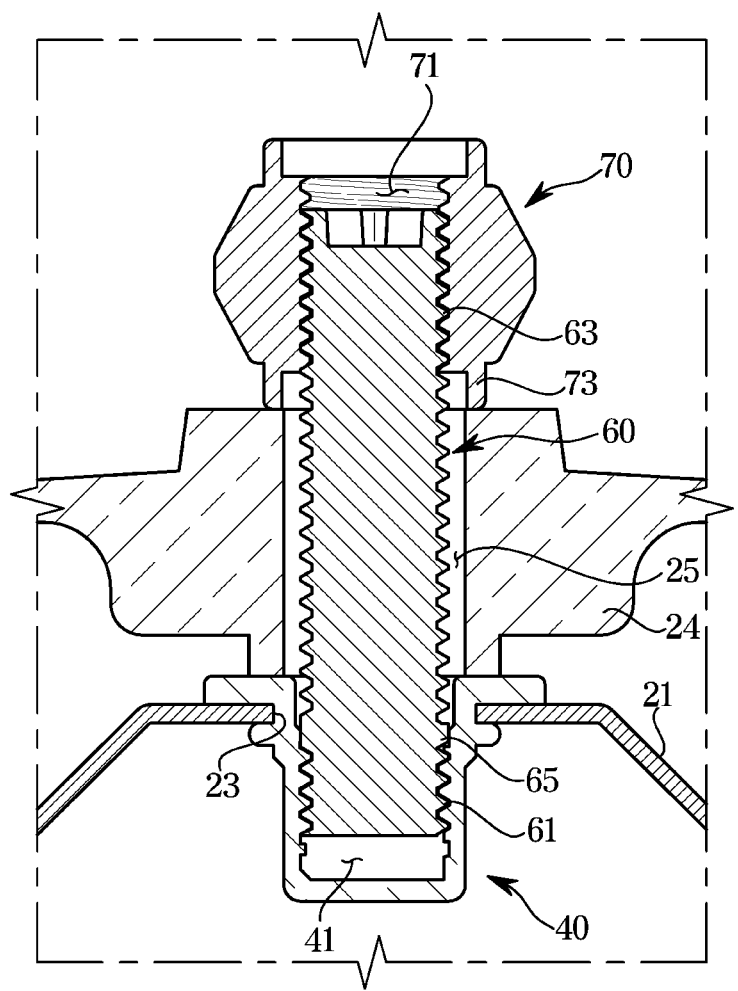
FIG. 7 is a cross-sectional view illustrating a state in which the second rear cover of FIG. 6 has different thicknesses.

FIG. 4 is a view illustrating the set screw according to an embodiment of the disclosure. FIG. 5 is a view illustrating the cap nut according to an embodiment of the disclosure. FIG. 6 is a cross-sectional view illustrating a state in which the set screw is fastened to the mounting member assembled to the first rear cover and the cap nut is fastened to the set screw according to an embodiment of the disclosure. FIG. 7 is a cross-sectional view illustrating a state in which the second rear cover of FIG. 6 has different thicknesses.

As illustrated in FIGS. 4 to 7, the set screw 60 may include a first male screw 61 fastened to the fastening groove 41 of the mounting member 40. The first male screw 61 may be formed on an outer peripheral surface of the set screw 60. Between opposite ends of the set screw 60, the first male screw 61 may be formed at one end fastened to the fastening groove 41 of the mounting member 40.

The set screw 60 may include a second male screw 63 to which the cap nut 70 is fastened. The second male screw 63 may be formed on the outer peripheral surface of the set screw 60. The second male screw 63 may be formed at the other end opposite to the one end, at which the first male screw 61 is formed, between opposite ends of the set screw 60.

The set screw 60 may include a rotation preventer 65 formed between the first male screw 61 and the second male screw 63. The rotation preventer 65 may be a non-threaded section in which male screw is not formed. The set screw 60 may be rotated to be fastened to the fastening groove 41 of the mounting member 40. The set screw 60 may be rotated and the first male screw 61 may be fastened to the fastening groove 41. After the first male screw 61 is fastened to the fastening groove 41, it is possible to prevent the rotation of the set screw 60 because the rotation preventer 65 corresponding to non-threaded section may be formed. The rotation preventer 65 may limit a length of the first male screw 61 fastened to the mounting member 40. The rotation preventer 65 may be formed at a position in which the length of the first male screw 61 is less than a depth of the mounting member 40 to which the set screw 60 is fastened. That is, the rotation preventer 65 may be formed at a position in which the length of the first male screw 61 is less than a depth of the fastening groove 41. Accordingly, one end of the set screw 60 may not come into contact with a bottom surface of the fastening groove 41. Because the first male screw 61 corresponding to one end of the set screw 60 does not come into contact with the bottom surface of the fastening groove 41, it is possible to prevent the set screw 60 from rotating and penetrating the bottom surface of the fastening groove 41.

The set screw 60 may include a cross head 67 formed at the end of the second male screw 63. The cross head 67 may be formed as a cross-shaped groove to allow the set screw 60 to be rotated using a driver or the like.

The cap nut 70 may be fastened to the second male screw 63 of the set screw 60. The cap nut 70 may include a fastening hole 71 fastened to the second male screw 63 of the set screw 60. A female screw may be formed on an inner peripheral surface of the fastening hole 71. The fastening hole 71 may be formed to pass through the cap nut 70. The fastening hole 71 may be formed to pass through the cap nut 70 in a direction in which the cap nut 70 is fastened to the set screw 60. Because the fastening hole 71 is formed to pass through the cap nut 70, a length of the fastening hole 71 fastened to the second male screw 63 may be adjusted according to the thickness of the second rear cover 24.

In the rear cover 20, the first rear cover 21 to which the mounting member 40 is assembled may have the same thickness regardless of the type of product.

However, the second rear cover 24 may have various thicknesses according to the type of product. Accordingly, in the second male screw 63 of the set screw 60 that is fastened to the mounting member 40 through the through hole 25 (refer to FIG. 3) of the second rear cover 24, a part of the second male screw 63 protruding to the outside of the second rear cover 24 may have various lengths according to the thickness of the second rear cover 24. Because the fastening hole 71 is formed to pass through the cap nut 70, a length of the cap nut 70 fastened to the second male screw 63 may be adjusted according to the length of the part of the second male screw 63 protruding to the outside of the second rear cover 24.

That is, based on the comparison between FIG. 6 and FIG. 7, the thickness of the second rear cover 24 shown in FIG.

6 may be greater than the thickness of the second rear cover 24 shown in FIG. 7. Based on the second rear cover 24 being thick, the length of the second male screw 63 protruding to the outside of the second rear cover 24 may be reduced. Accordingly, as shown in FIG. 6, based on the second male screw 63 protruding to the outside of the second rear cover 24 being short, a portion of the fastening hole 71 of the cap nut 70 may be fastened to the second male screw 63. Further, as shown in FIG. 7, based on the second male screw 63 protruding to the outside of the second rear cover 24 being long, most of the fastening hole 71 of the cap nut 70 may be fastened to the second male screw 63.

Figure 8:
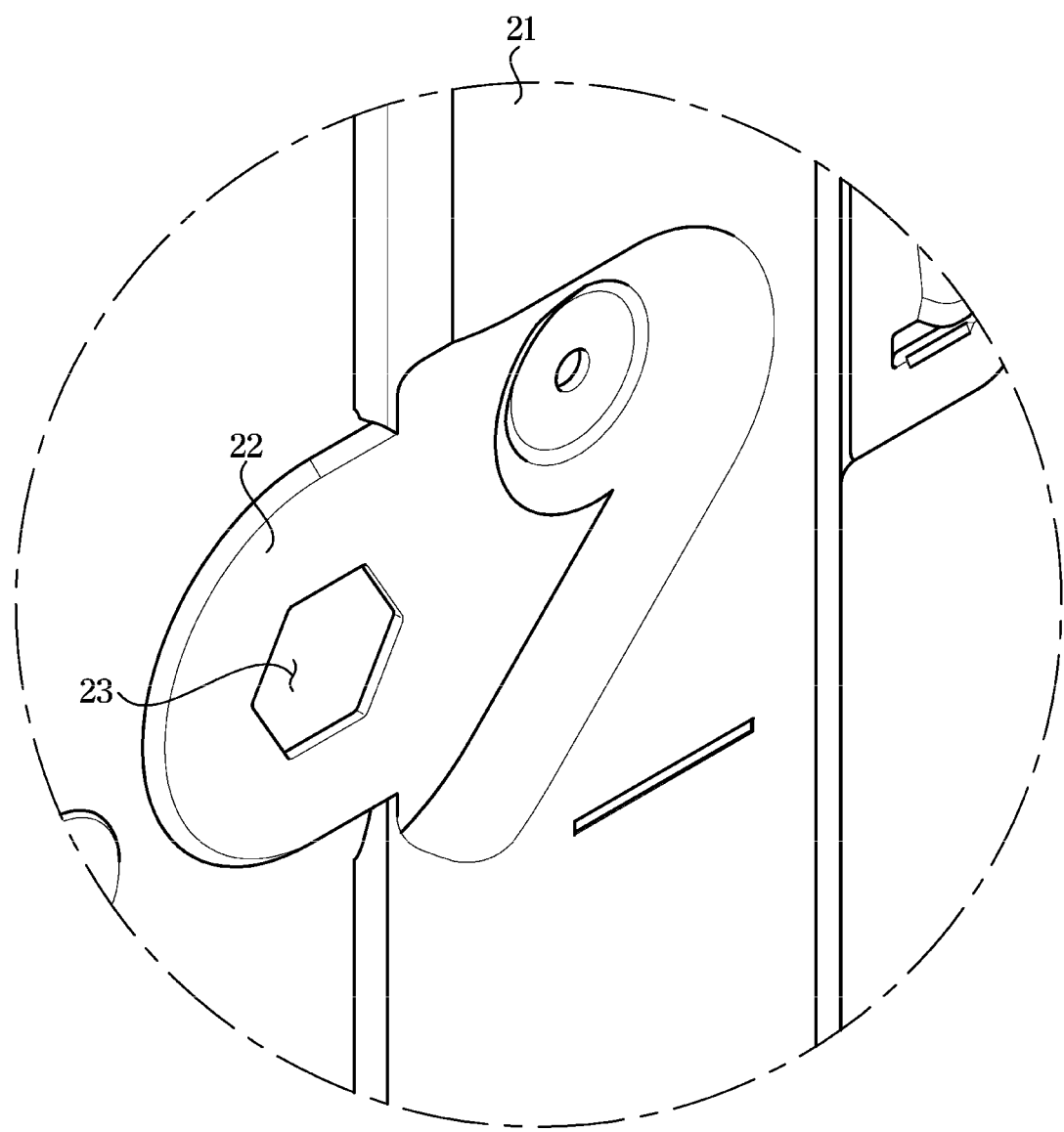
FIG. 8 is a view illustrating a state in which an assembly member is formed in the first rear cover and an assembly hole is formed in the assembly member according to an embodiment of the disclosure.
Figure 9:
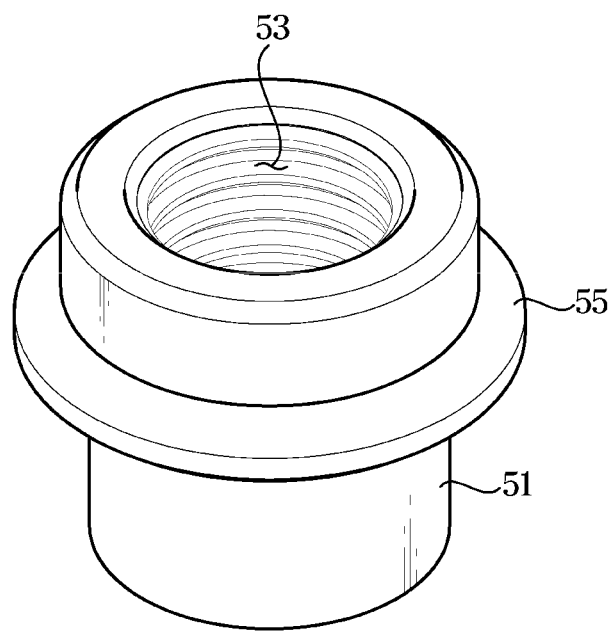
FIG. 9 is a view illustrating a mounting member according to another embodiment of the disclosure.
Figure 10:
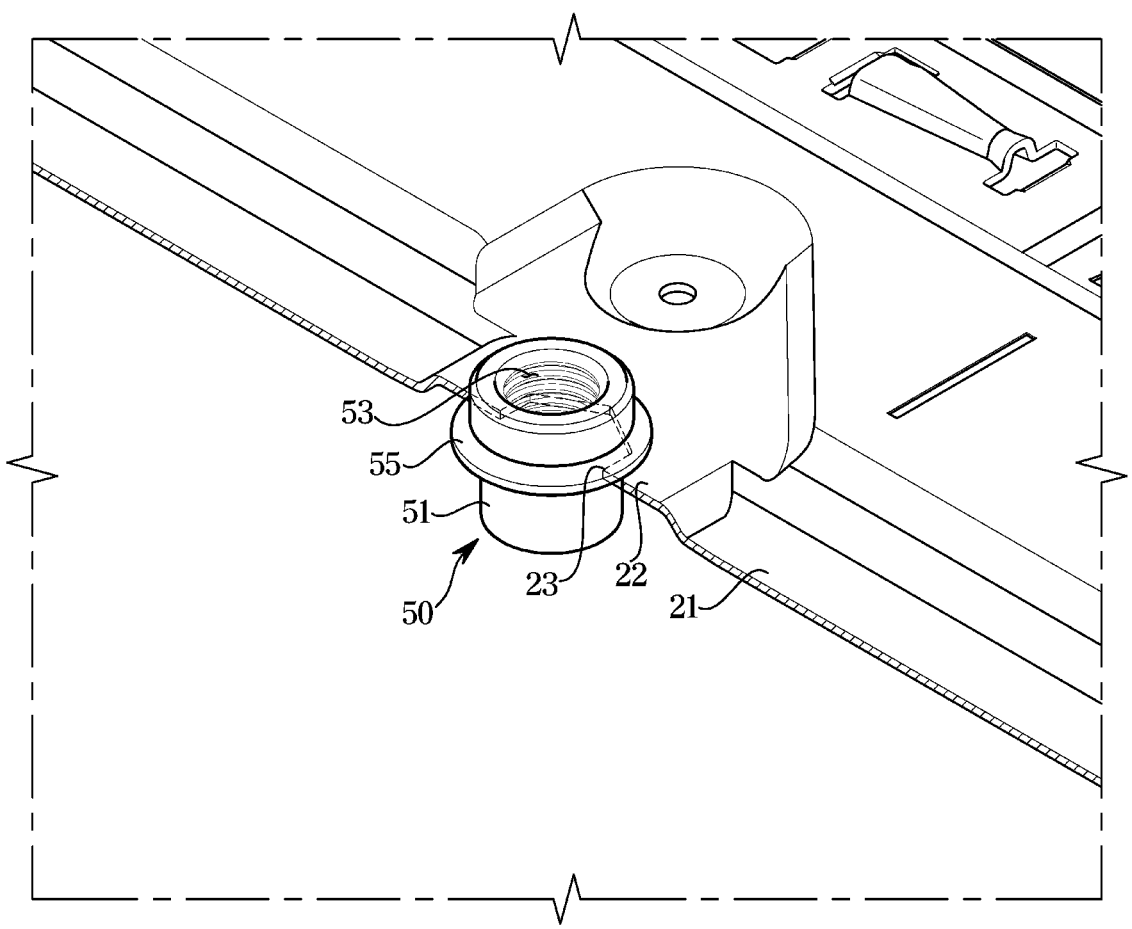
FIG. 10 is a view illustrating a state in which the mounting member is inserted into the assembly hole of the first rear cover according to another embodiment of the disclosure.
Figure 11:
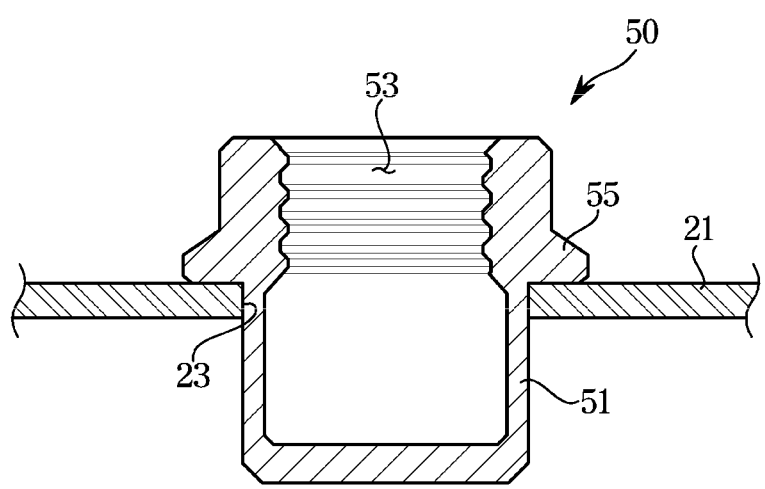
FIG. 11 is a cross-sectional view illustrating the state in which the mounting member is inserted into the assembly hole of the first rear cover according to another embodiment of the disclosure.
Figure 12:
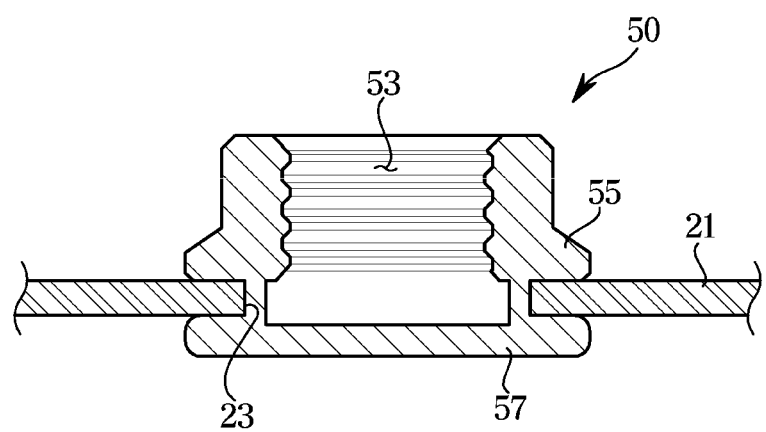
FIG. 12 is a cross-sectional view illustrating a state in which the mounting member inserted into the assembly hole of the first rear cover is press-fitted and assembled according to another embodiment of the disclosure.
Figure 13:
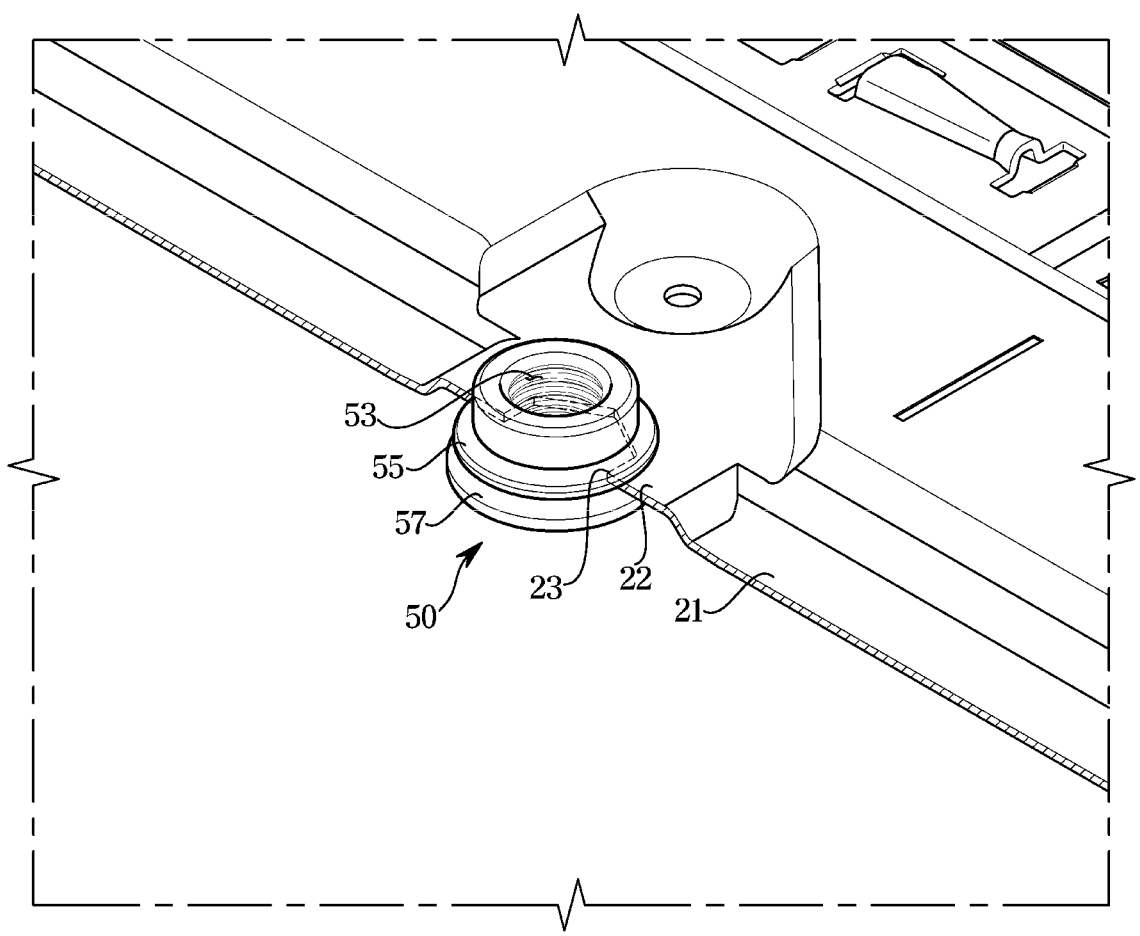
FIG. 13 is a view illustrating a state in which the mounting member is press-fitted and assembled into the assembly hole of the first rear cover according to another embodiment of the disclosure.

FIG. 8 is a view illustrating a state in which an assembly member is formed in the first rear cover and an assembly hole is formed in the assembly member according to an embodiment of the disclosure. FIG. 9 is a view illustrating a mounting member according to another embodiment of the disclosure. FIG. 10 is a view illustrating a state in which the mounting member is inserted into the assembly hole of the first rear cover according to another embodiment of the disclosure. FIG. 11 is a cross-sectional view illustrating the state in which the mounting member is inserted into the assembly hole of the first rear cover according to another embodiment of the disclosure. FIG. 12 is a cross-sectional view illustrating a state in which the mounting member inserted into the assembly hole of the first rear cover is press-fitted and assembled according to another embodiment of the disclosure. FIG. 13 is a view illustrating a state in which the mounting member is press-fitted and assembled into the assembly hole of the first rear cover according to another embodiment of the disclosure.

As illustrated in FIGS. 8 to 11, the first rear cover 21 may include the assembly member 22 to which the mounting member 50 is assembled. The assembly member 22 may be provided to protrude toward the second rear cover 24 (refer to FIG. 3).

The assembly hole 23 into which the mounting member 50 is inserted and assembled may be formed in the assembly member 22. The assembly hole 23 may be formed to include a hexagonal shape to prevent rotation of the mounting member 50 that is inserted into and assembled to the assembly hole 23. Although it is illustrated that the shape of the assembly hole 23 is a hexagonal shape on the drawing, the shape of the assembly hole 23 is not limited to a hexagonal shape. Therefore, the assembly hole 23 may have various shapes as long as the shape is provided to prevent the rotation after the mounting member 50 including a cylindrical shape is inserted into the assembly hole 23. In addition, although it is illustrated that the mounting member 50 is assembled to the assembly hole 23 formed in the assembly member 22 of the first rear cover 21, the mounting member 40 shown in FIGS. 3, 6 and 7 may also be assembled into the assembly hole 23 formed in the assembly member 22 of the first rear cover 21.

The mounting member 50 may include a cylindrical shape. The mounting member 50 may include an insertion member 51 inserted into the assembly hole 23 of the first rear cover 21. Because the insertion member 51 is provided in a cylindrical shape, the insertion member 51 may be insertable to the assembly hole 23 in any direction.

The mounting member 50 may include a fastening groove 53 to which the set screw 60 (refer to FIG. 14) is fastened. The fastening groove 53 may be provided on an upper side of the insertion member 51. The first male screw 61 (refer to FIG. 14) of the set screw 60 (refer to FIG. 14) may be fastened to the fastening groove 53. A female screw to which the first male screw 61 is fastened may be formed on an inner peripheral surface of the fastening groove 53.

The mounting member 50 may include a flange 55 formed between the insertion member 51 and the fastening groove 53. The flange 55 may be provided to protrude from the outer peripheral surface of the mounting member 50 to have a larger diameter than the assembly hole 23. The flange 55 has a larger diameter than the assembly hole 23, and thus in response to inserting the insertion member 51 to the assembly hole 23, the flange 55 may be caught in the assembly hole 23 and the mounting member 50 may be fixed. That is, the mounting member 50 may be fixed to the first rear cover 21 because the flange 55 is caught in the assembly hole 23 in the direction in which the mounting member 50 is inserted into the assembly hole 23.

The mounting member 50 may be fixed by the pressure of a press device (not shown) in a state in which the insertion member 51 is inserted into the assembly hole 23 of the first rear cover 21. That is, the mounting member 50 may be fixed by pressure in a direction, in which the mounting member 50 is inserted into the assembly hole 23, to allow the flange 55 to be caught in the assembly hole 23.

As shown in FIGS. 12 to 13, in response to a pressure, in a direction that is opposite to the direction in which the mounting member 50 is inserted into the assembly hole 23, is applied the mounting member 50 by the press device in a state in which the mounting member 50 is fixed, the insertion member 51 (refer to FIGS. 10 and 11) may be press-fitted. In this case, the insertion member 51 may be deformed into a hexagonal shape corresponding to the shape of the assembly hole 23. The insertion member 51 may be deformed into a hexagonal shape corresponding to the shape of the assembly hole 23, thereby preventing the rotation of the mounting member 50. By the press-fitting method, the insertion member 51 may be deformed into a hexagonal shape and transformed into a fixer 57 fixed to the first rear cover 21. As the insertion member 51 is transformed into the fixer 57 by the press-fitting method, the mounting member 50 may be fixed and assembled to the first rear cover 21 by the flange 55 and the fixer 57.

Figure 14:
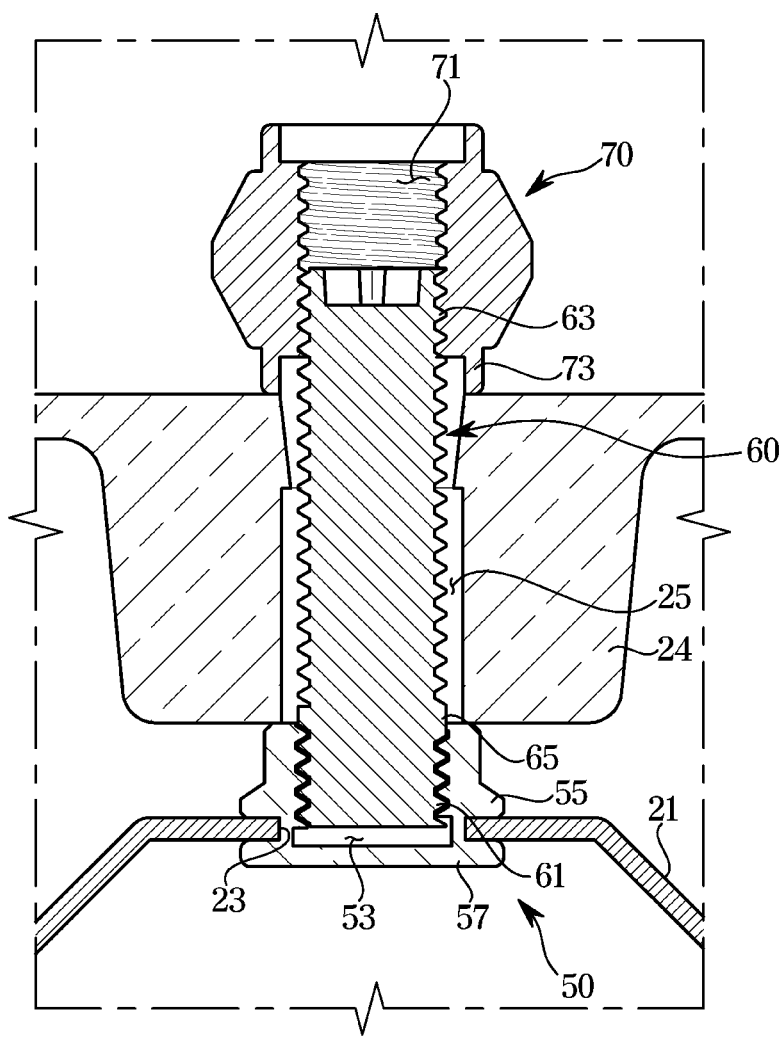
FIG. 14 is a cross-sectional view illustrating a state in which a set screw is fastened to the mounting member assembled to the first rear cover and a cap nut is fastened to the set screw according to another embodiment of the disclosure.
Figure 15:
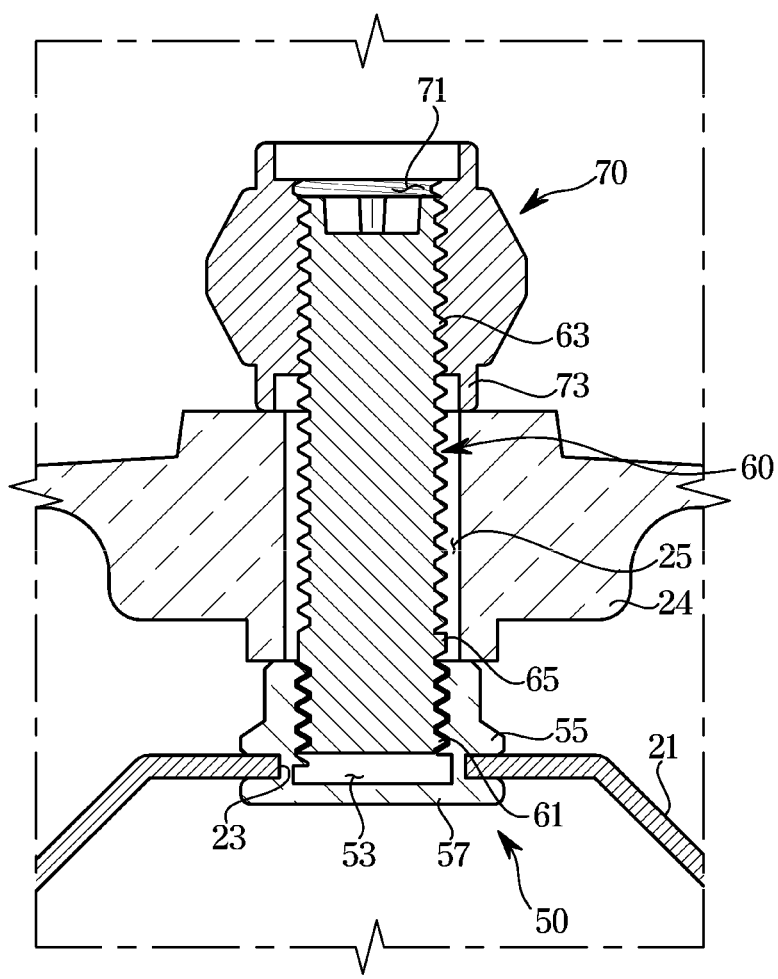
FIG. 15 is a cross-sectional view illustrating a state in which the second rear cover of FIG. 14 has different thicknesses.

FIG. 14 is a cross-sectional view illustrating a state in which a set screw is fastened to the mounting member assembled to the first rear cover and a cap nut is fastened to the set screw according to another embodiment of the disclosure. FIG. 15 is a cross-sectional view illustrating a state in which the second rear cover of FIG. 14 has different thicknesses.

As illustrated in FIGS. 14 and 15, the second rear cover 24 may have various thicknesses according to the type of product. Accordingly, in the second male screw 63 of the set screw 60 that is fastened to the mounting member 50 through the through-hole 25 of the second rear cover 24, a part of the second male screw 63 protruding to the outside of the second rear cover 24 may have various lengths according to the thickness of the second rear cover 24. Because the fastening hole 71 is formed to pass through the cap nut 70, a length of the cap nut 70 fastened to the second male screw 63 may be adjusted according to the length of the part of the second male screw 63 protruding to the outside of the second rear cover 24.

That is, based on the comparison FIG. 14 and FIG. 15, the thickness of the second rear cover 24 shown in FIG. 14 may be greater than the thickness of the second rear cover 24 shown in FIG. 15. Based on the second rear cover 24 being thick, the length of the second male screw 63 protruding to the outside of the second rear cover 24 may be reduced. Accordingly, as shown in FIG. 14, based on the second male screw 63 protruding to the outside of the second rear cover 24 being short, a portion of the fastening hole 71 of the cap nut 70 may be fastened to the second male screw 63. In addition, as shown in FIG. 15, based on the second male screw 63 protruding to the outside of the second rear cover 24 being long, most of the fastening hole 71 of the cap nut 70 may be fastened to the second male screw 63.

As is apparent from the above description, a structure for fixing a display apparatus to a wall mount may be improved and thus it is possible to simplify assembly specifications for fixing the display apparatus to the wall mount.

Further, the number of screws for fixing a display apparatus to a wall mount may be reduced, and thus it is possible to exclude a washer, thereby reducing material cost.

Further, when a set screw is fastened to a mounting member, it is possible to prevent the set screw from penetrating a bottom surface of a mounting member.

Further, it is possible to fix an ultra-slim display apparatus to a wall mount.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus fixable to a wall mount, the display apparatus comprising:
   a display;
   a rear cover including,
   a first rear cover coupled to a rear surface of the display and having an assembly hole, and
   a second rear cover couplable to the first rear cover;
   a mounting member inserted into to the assembly hole and configured with an interior that extends through the assembly hole and receives a set screw to fix the display to the wall mount;
   the set screw includes a first end that is fastenable to the interior of the mounting member and a non-threaded section to limit a length of the set screw received into the interior of the mounting member; and
   a cap nut including a fastening hole that passes through the cap nut and is fastenable to a second end of the set screw so that a length of the second end fastenable to the fastening hole is adjustable based on a thickness of the second rear cover,
   the length of the second end fastenable to the fastening hole does not exceed a length of the fastening hole, and
   with the cap nut fastened to the second end of the set screw, the display apparatus is fixable to the wall mount.

2. The display apparatus of claim 1, wherein
   the first end is a first male screw fastenable to the interior of mounting member, and
   the second end is a second male screw fastenable to the fastening hole of the cap nut.

3. The display apparatus of claim 2, wherein
   the non-threaded section is between the first male screw and the second male screw.

4. The display apparatus of claim 3, wherein
   the non-threaded section is at a position in which a length of the first male screw is less than a depth of the mounting member.

5. The display apparatus of claim 1, wherein
   the second rear cover includes a through-hole at a position corresponding to the assembly hole so that, with the mounting member inserted into the assembly hole and the second rear cover coupled to the rear surface of the first rear cover, the set screw is passable through the through-hole and insertable into the interior.

6. The display apparatus of claim 5, wherein the fastening hole of the cap nut includes a female screw on an inner peripheral surface of the cap nut to which the second end of the set screw is fastenable.

7. The display apparatus of claim 6, wherein the fastening hole is configured so that the length of the second end of the set screw fastenable to the fastening hole is less than the length of the fastening hole.

8. The display apparatus of claim 1, wherein the first rear cover includes:
   an assembly member in which the assembly hole is formed, and the assembly member protrudes toward the second rear cover.

9. The display apparatus of claim 8, wherein
   the assembly hole includes a hexagonal shape so that, with the mounting member inserted into the assembly hole, rotation of the mounting member in the assembly hole is prevented.

10. The display apparatus of claim 9, wherein the mounting member includes:
    an insertion member formed in having a cylindrical shape and insertable into the assembly hole,
    a fastening groove to which the set screw is fastened, and
    a flange between the insertion member and the fastening groove that protrudes from an outer peripheral surface of the mounting member to have a larger diameter than the assembly hole.

11. The display apparatus of claim 10, wherein
    the flange is caught in the assembly hole so that the mounting member is fixed in the assembly hole in a direction in which mounting member is inserted into the assembly hole.

12. The display apparatus of claim 11, wherein
    the mounting member is fixed to the first rear cover by the insertion member being press-fit in a state in which the insertion member is inserted into the assembly hole.

13. The display apparatus of claim 12, wherein
    the insertion member is press-fit in the assembly hole so as to be deformed into a hexagonal shape corresponding to the assembly hole, thereby preventing rotation thereof, and a fixer having a larger diameter than the assembly hole is formed on a side of the first rear cover opposite the flange so that the mounting member is fixed to the first rear cover by the flange and the fixer.

\* \* \* \* \*